United States Patent
Ishino et al.

(10) Patent No.: US 10,468,289 B2
(45) Date of Patent: Nov. 5, 2019

(54) SUBSTRATE HOLDING MEMBER

(71) Applicant: NGK SPARK PLUG CO., LTD., Nagoya, Aichi (JP)

(72) Inventors: Tomohiro Ishino, Tomiya (JP); Takashi Teshima, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 15/574,204

(22) PCT Filed: Dec. 16, 2016

(86) PCT No.: PCT/JP2016/087461
§ 371 (c)(1),
(2) Date: Nov. 15, 2017

(87) PCT Pub. No.: WO2017/110660
PCT Pub. Date: Jun. 29, 2017

(65) Prior Publication Data
US 2018/0130692 A1 May 10, 2018

(30) Foreign Application Priority Data

Dec. 25, 2015 (JP) ................. 2015-254670
Dec. 6, 2016 (JP) ................. 2016-236982

(51) Int. Cl.
*H01L 21/683* (2006.01)
*G03F 7/20* (2006.01)
*H01L 21/687* (2006.01)

(52) U.S. Cl.
CPC ............ *H01L 21/6838* (2013.01); *G03F 7/20* (2013.01); *H01L 21/6875* (2013.01)

(58) Field of Classification Search
CPC .......... B25B 11/00; B25B 11/02; B25B 13/44
See application file for complete search history.

(56) References Cited

U.S. PATENT DOCUMENTS 6,307,620 B1   10/2001  Takabayashi et al.
8,124,437 B2 *  2/2012  Huang .................. C03C 17/36
                                                      257/E31.13
(Continued)

FOREIGN PATENT DOCUMENTS

JP          5-205997 A      8/1993
JP       2000-311933 A     11/2000
(Continued)

OTHER PUBLICATIONS

Japan Patent Office, International Search Report in PCT/JP2016/087461 (International Stage of instant pplication), dated Jan. 17, 2017.
(Continued)

*Primary Examiner* — Lee D Wilson
(74) *Attorney, Agent, or Firm* — Stites & Harbison, PLLC; Jeffrey A. Haeberlin; James R. Hayne

(57) ABSTRACT

Provided is a substrate holding member that includes a base body and a plurality of protrusions formed on a surface of the base body and that is capable of suppressing generation of particles due to peeling-off or cracking of protective layers of the protrusions. A substrate holding member includes a base body and a plurality of protrusions formed on a surface of the base body. Each of the protrusions includes a base portion and a protective layer, the base portion having a flat upper end surface and being made from a silicon carbide sintered compact, the protective layer being made of silicon carbide. The protective layer includes a region on at least a part of the base portion from an edge of the upper end surface to a lower end of the base portion, the region being exposed along an entire periphery. Preferably, the protective layer is formed so as to cover at least only a part of an upper portion of the base portion, the upper portion including the upper end surface.

5 Claims, 2 Drawing Sheets

(56) References Cited

U.S. PATENT DOCUMENTS

| | | | |
|---|---|---|---|
| 2005/0183669 A1* | 8/2005 | Parkhe | ............... H01L 21/6831 |
| | | | 118/724 |
| 2008/0138504 A1 | 6/2008 | Williams | |
| 2011/0151611 A1* | 6/2011 | Huang | .................... C03C 17/36 |
| | | | 438/57 |
| 2014/0042716 A1* | 2/2014 | Miura | ............... H01L 21/67103 |
| | | | 279/128 |
| 2015/0240635 A1* | 8/2015 | Lachmann | ............ E21C 35/183 |
| | | | 299/105 |
| 2015/0311108 A1 | 10/2015 | Horiuchi | |
| 2018/0130692 A1* | 5/2018 | Ishino | ...................... G03F 7/20 |

FOREIGN PATENT DOCUMENTS

| | | |
|---|---|---|
| JP | 2005-310933 A | 11/2005 |
| JP | 2008-218802 A | 9/2008 |
| JP | 2009-54723 A | 3/2009 |
| JP | 4782744 B2 | 7/2011 |
| JP | 5063797 B2 | 10/2011 |

OTHER PUBLICATIONS

Korean Intellectual Property Office, Office Action (Notification of Reason for Refusal) issued in rresponding Application No. 10-2017-7033307, dated May 8, 2019.

Taiwan Intellectual Property Office, Office Action issued in corresponding Application No. 105142863 dated Jun. 27, 2018. (English translation is not available.).

Taiwan Intellectual Property Office, Office Action issued in corresponding Application No. 105142863 dated Nov. 27, 2018. (English translation is not available.).

* cited by examiner

SUBSTRATE HOLDING MEMBER

TECHNICAL FIELD

The present invention relates to a substrate holding member for holding a substrate, such as a semiconductor wafer, by suction.

BACKGROUND ART

In semiconductor manufacturing equipment, particularly in an exposure device, for example, a substrate holding member that includes a base body and a plurality of protrusions formed on a surface of the base body is used to hold a wafer when exposing the wafer to light. The substrate holding member is required to have extremely high flatness as well as electroconductivity for preventing circuit breakage due to static electricity. Therefore, an electroconductive and highly rigid material, such as silicon carbide (hereinafter, referred to as "SiC"), is used. In particular, a silicon carbide sintered compact (hereinafter, referred to as "SiC sintered compact") is used as the material of the protrusions of the substrate holding member. In order to suppress wear or the like due to contact with a wafer, the protrusions, which are made from a SiC sintered compact, are coated with a SiC film (protective layer). Subsequent to coating, surface machining, such as abrasive blasting or polishing, is performed. The SiC coating is formed on the entire surface of the substrate holding member (see, for example, PTLs 1 and 2).

CITATION LIST

Patent Literature

PTL 1: Japanese Patent No. 4782744
PTL 2: Japanese Patent No. 5063797

SUMMARY OF INVENTION

Technical Problem

It is strongly required for a semiconductor manufacturing process, in particular, for an exposure process device, which forms a circuit pattern, to suppress generation of particles. Accordingly, it is required that the substrate holding member does not generate particles.

However, when the entire surface of the substrate holding member is coated with a SiC film as described in PTLs 1 and 2, in the protrusions formed on the surface, peeling-off or cracking may occur between a base portion (made from a SiC sintered compact) and the SiC film (protective layer) due to a small difference in properties between the base portion and the SiC film while the substrate holding member is used for a long period. Presumably, this occurs for the following reason: the base portion and the SiC film, which are made from the same material by using different methods, differ slightly in properties, such as coefficient of linear expansion, modulus of elasticity, density, hardness, and crystallizability; and therefore a stress is generated due to the difference in thermal expansion rate as temperature changes or a stress is generated when holding a wafer by suction or when releasing the wafer. That is, such a stress may propagate to a lower part of the SiC film on the base portion and may cause peeling-off or cracking. Improvement has been needed, because such peeling-off or cracking of the SiC film may lead to generation of particles.

An object of the present invention, which has been devised to solve the problem described above, is to provide a substrate holding member that includes a base body and a plurality of protrusions formed on a surface of the base body and that is capable of suppressing generation of particles due to peeling-off or cracking of protective layers formed on the protrusions.

Solution to Problem

According to a first aspect of the present invention, a substrate holding member includes a base body and a plurality of protrusions formed on a surface of the base body. Each of the protrusions includes a base portion and a protective layer, the base portion having a flat upper end surface and being made from a silicon carbide sintered compact, the protective layer being made of silicon carbide. The protective layer includes a region on at least a part of the base portion from an edge of the upper end surface to a lower end of the base portion, the region being exposed along an entire periphery.

According to a second aspect of the present invention, a substrate holding member includes a base body and a plurality of protrusions formed on a surface of the base body. Each of the protrusions includes a base portion and a protective layer, the base portion having a flat upper end surface and being made from a silicon carbide sintered compact, the protective layer being made of at least one material selected from silicon carbide, diamond-like carbon, TiN, TiC, TiCN, TiAlN, TiO$_2$, CrN, Y$_2$O$_3$, and Al$_2$O$_3$. The protective layer includes a region on at least a part of the base portion from an edge of the upper end surface to a lower end of the base portion, the region being exposed along an entire periphery.

In the substrate holding member according to the present invention, in each of the plurality of protrusions formed on the surface of the base body, the protective layer, which is formed on a surface of the base portion made from a silicon carbide sintered compact, includes a region on a part of the base portion from the edge of the upper end surface to the lower end of the base portion, the region being exposed along the entire periphery. That is, the protective layer is discontinuous at a part of the based portion between the edge of the upper end surface and the lower end of the base portion. With such a structure, compared with a case where the protective layer is formed on the entire surface of the substrate holding member, propagation of a stress generated in the protective layer can be suppressed, peeling-off or cracking of the protective layer does not occur easily, and generation of particles due to such a fault can be suppressed.

In the substrate holding member according to the present invention, preferably, the protective layer is formed so as to cover at least only a part of an upper portion of the base portion, the upper portion including the upper end surface. With such a structure, the contact area between the base portion and the protective layer can be reduced, and the aforementioned advantageous effects can be efficiently obtained. Moreover, since the amount of material of the protective layer is small, generation of particles due to the material can be further suppressed.

In this case, the protective layer may be formed so as to cover only the upper end surface of the base portion, or the protective layer may be formed so as to cover the upper end surface of the base portion and to cover a part of a side surface of the base portion along the entire periphery, the side surface being continuous with the upper end surface.

DESCRIPTION OF EMBODIMENTS

A substrate holding member according to the present invention includes a base body and a plurality of protrusions formed on a surface of the base body. Each of the protrusions includes a base portion and a protective layer, the base portion having a flat upper end surface and being made from a silicon carbide sintered compact. The protective layer includes a region on at least a part of the base portion from an edge of the upper end surface to a lower end of the base portion, the region being exposed along an entire periphery.

Hereinafter, a substrate holding member according to an embodiment of the present invention will be described with reference to the drawings.

Figure 1:
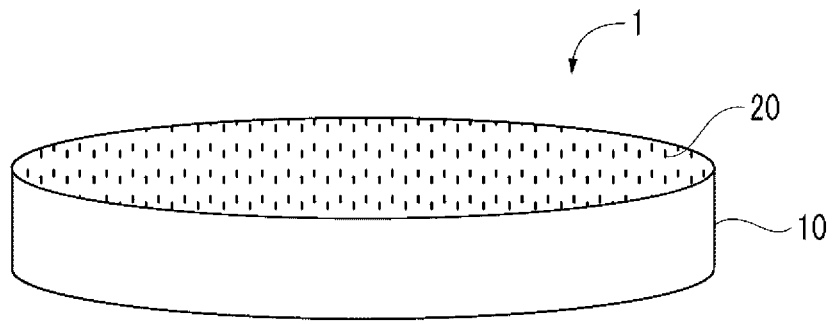
FIG. 1 is a perspective view of a substrate holding member according to an embodiment of the present invention.

FIG. 1 a perspective view of a substrate holding member 1 according to an embodiment of the present invention. The substrate holding member 1 includes a base body 10, which is made from a silicon carbide sintered compact and which has a disk-like shape, and a plurality of protrusions 20 formed on a surface of the base body 10.

Figure 2:
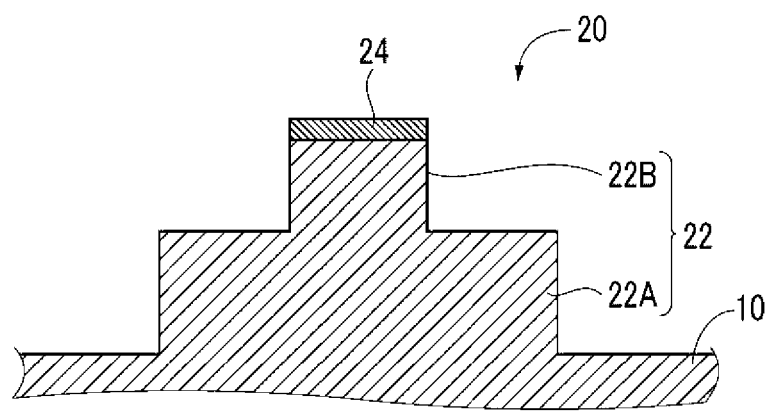
FIG. 2 is an enlarged sectional view of a protrusion of the substrate holding member shown in FIG. 1.

FIG. 2 is a sectional view of one of the protrusions 20 formed on the surface of the base body 10. The protrusion 20 shown in FIG. 2 includes a base portion 22, which is made from a silicon carbide sintered compact, and a protective layer 24. In the example shown in FIG. 2, the base portion 22 includes a lower base portion 22A that has a cylindrical shape and an upper base portion 22B that protrudes upward from the lower base portion 22A. The upper base portion 22B has a cylindrical shape having a diameter smaller than that of the lower base portion 22A. The upper end surface of the upper base portion 22B is flat. In FIG. 2, the shape and dimensional ratios of the protrusion 20 are exaggerated without taking their actual values into consideration. Accordingly, the shape and dimensional ratios in FIG. 2 are not necessarily the same as those of an actual protrusion. The same applies to FIGS. 3 to 6 described below.

In order to suppress wear or the like due to contact with a wafer, the protective layer 24 is formed on the entirety of the upper end surface of the base portion 22 (the upper base portion 22B). The protective layer 24 is made of at least one material selected from silicon carbide, diamond-like carbon, TiN, TiC, TiCN, TiAlN, $TiO_2$, CrN, $Y_2O_3$, and $Al_2O_3$. In the example shown in FIG. 2, the protective layer 24 is formed only on the entirety of the upper end surface of the base portion 22 and is not formed on the side surface of the base portion 22 or on the surface of the base body 10 (part of the surface on which the protrusions 20 are not formed). Since the protective layer 24 is formed only on the upper end surface of the base portion 22, as described above, compared with a case where the protective layer is formed on the entire surface of the substrate holding member, peeling-off or cracking of the protective layer does not occur easily, and generation of particles due to such a fault can be suppressed.

Figure 3:
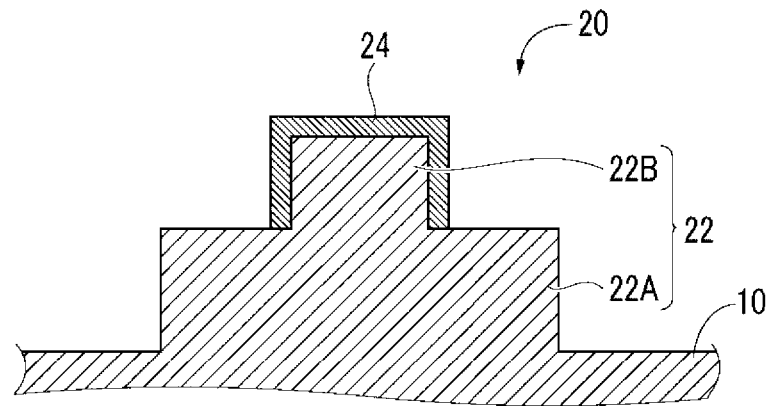
FIG. 3 is a sectional view of a protrusion according to a modification, which is different from the protrusion shown in FIG. 2.

In the protrusion 20 shown in FIG. 2, the protective layer 24 is formed only on the entirety of the upper end surface. However, preferably, as illustrated in FIG. 3, the protective layer 24 is formed so as to cover the upper end surface of the base portion 22 and to cover a part of the side surface along the entire periphery, the side surface being continuous with the upper end surface. The protective layer 24 on the upper end surface particularly receives a stress due to contact with a substrate. However, by forming the protective layer 24 on a part of the side surface that is continuous with the end surface as illustrated in FIG. 3, the contact area between the protective layer 24 and the base portion 22 is increased, and the effect of preventing peeling-off of the protective layer 24 can be increased.

In FIGS. 2 and 3, the protective layer 24 is formed so as to cover at least only a part of an upper portion of the base portion 22, the upper portion including the upper end surface. Here, the term "upper portion" refers to a portion of the base portion 22 that is above a midpoint between the upper end and the lower end. To be specific, the "upper portion" is a portion that is within a height of, preferably, 1 to 100 μm, and more preferably, 5 to 30 μm, when the top of the protrusion 20 is defined as the reference point of height.

Figure 4:
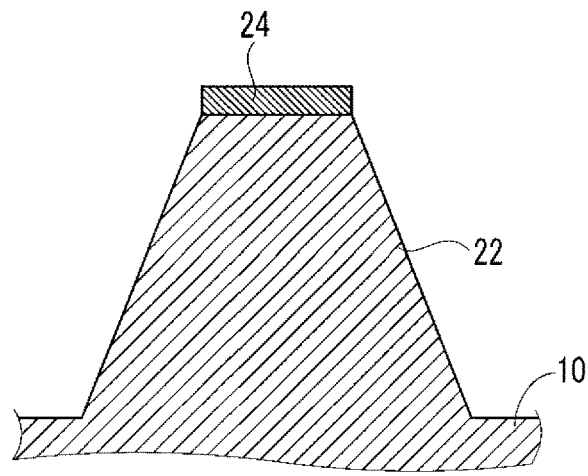
FIG. 4 is a sectional view of a protrusion according to a modification, which is different from the protrusion shown in FIG. 2.
Figure 5:
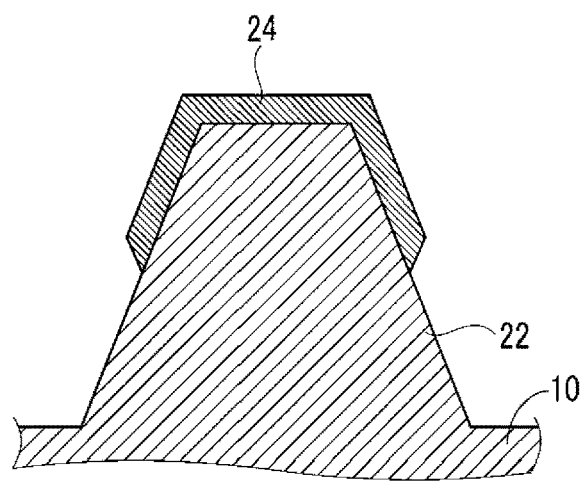
FIG. 5 is a sectional view of a protrusion according to a modification, which is different from the protrusion shown in FIG. 2.

In the examples described above, the protrusion 20, which is formed on the surface of the base body 10, includes the upper base portion and the lower base portion that have solid cylindrical shapes having different diameters. However, the shape of a protrusion according to the present invention is not limited to this shape. For example, as illustrated in FIGS. 4 and 5, the base portion may have a conical frustum shape. In FIGS. 4 and 5, elements that are substantially the same as those shown in FIG. 2 are indicated by the same numerals. Although not illustrated, the base portion may have a simple cylindrical shape or a simple pyramidal shape. Whichever shape the base portion has, by forming the protective layer so as to cover only a part of the upper portion of the base portion, the upper portion including the upper end surface, the advantageous effects of the present invention can be obtained.

Figure 6:
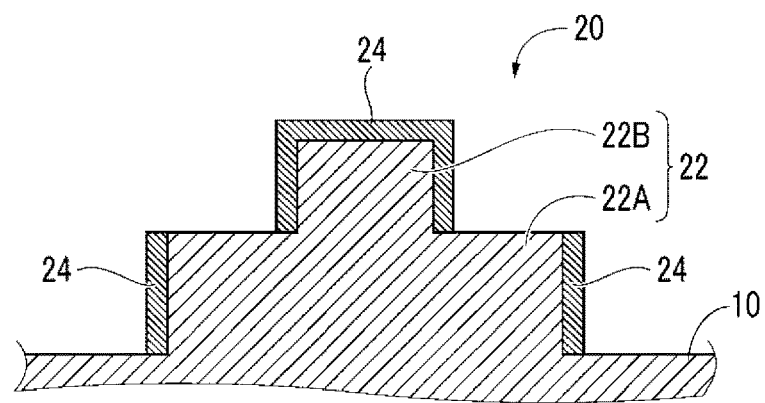
FIG. 6 is a sectional view of a protrusion according to a modification, which is different from the protrusion shown in FIG. 2.

In the embodiment described above, as a preferred embodiment, the protective layer covers only a part of the upper portion of the base portion, the upper portion including the upper end surface. Theoretically, however, as illustrated in FIG. 6, the protective layer only needs to include a region on at least a part of the base portion 22 from the edge of the upper end surface to the lower end of the base portion 22, the region being exposed along the entire periphery. In FIG. 6, elements that are the same as those shown in FIG. 2 are indicated by the same numerals. In this structure, as described above, the protective layer 24 is discontinuous at a part of the base portion 22 from the edge of the upper end surface to the lower end of the base portion 22. Therefore, propagation of a stress generated in the protective layer 24 is suppressed. As a result, peeling-off or cracking of the protective layer 24 does not occur easily, and generation of particles due to such a fault can be suppressed.

A substrate holding member according to the present invention can be manufactured, for example, as follows.

First, a substantially disk-shaped compact is made from silicon carbide, and, by sintering the compact in an Ar gas atmosphere in a temperature range of 1900 to 2100° C., a substantially disk-shaped silicon carbide sintered compact is formed. Next, a plurality of base portions 22 are formed by grinding, sandblasting, or electrodischarge machining the upper surface of the silicon carbide sintered compact. Further, for example, the protective layer 24 of silicon carbide is formed so as to cover the upper surface of the base body 10 and the surfaces of the base portions 22 by chemical vapor deposition (CVD), physical vapor deposition (PVD), plating, vapor deposition, plasma ion implantation, or ion plating. Preferably, the protective layer 24 is formed by using PVD, among the above methods, because the film-forming process temperature of PVD is relatively low and therefore thermal deformation of the base portions 22 can be suppressed. The protective layer 24, which is formed as described above, covers the entirety of the upper surface of the base body 10 and the surfaces of the base portions 22. According to the present invention, (1) the protective layer 24 is to be formed only on the entirety of the upper end surface of each base portion, or (2) the protective layer 24 is to be formed so as to extend over the entirety of the upper end surface to a middle part of the side surface of each base portion that is continuous with the upper end surface. Therefore, the protective layer 24 in a region that does not correspond to (1) or (2) is removed. Moreover, the protective layer 24 is polished so that at least the top surfaces of the protrusions 20 become flat.

With the substrate holding member according to the present invention described above, for example, the substrate holding member 1 supports a substrate such as a semiconductor wafer, which is an object to be held by suction, so that the substrate is in contact with each of the plurality of protrusions 20. Then, the substrate holding member 1 holds the substrate, which is an object to be held by suction, by using a suction force that is generated by a vacuum sucking device, which is a vacuum pump or the like connected to a vacuum sucking path formed in the base body 10, sucks air in a space defined by the substrate holding member 1 and the substrate.

REFERENCE SIGNS LIST

1 substrate holding member
10 base body
20 protrusion
22 base portion
24 protective layer

The invention claimed is:

1. A substrate holding member comprising:
    a base body formed from a silicon carbide sintered compact; and
    a plurality of protrusions formed on a surface of the base body, wherein each of the protrusions includes:
        a base portion having a flat upper end surface and being formed from the silicon carbide sintered compact; and
        a protective layer covering the flat upper end surface and being formed from silicon carbide which is not sintered; and
    wherein the surface of the base body and a portion of the base portion of each of the protrusions are not covered by the protective layer.

2. The substrate holding member according to claim 1, wherein the protective layer is formed so as to cover at least only a part of an upper portion of the base portion, the upper portion including the upper end surface.

3. The substrate holding member according to claim 2, wherein the protective layer is formed so as to cover only the upper end surface of the base portion.

4. The substrate holding member according to claim 2, wherein the protective layer is formed so as to cover the upper end surface of the base portion and to cover a part of a side surface of the base portion along the entire periphery, the side surface being continuous with the upper end surface.

5. A substrate holding member comprising:
    a base body formed from a silicon carbide sintered compact; and
    a plurality of protrusions formed on a surface of the base body, wherein each of the protrusions includes:
        a base portion having a flat upper end surface and being formed from the silicon carbide sintered compact; and
        a protective layer covering the flat upper end surface and being formed from at least one unsintered material selected from silicon carbide, diamond-like carbon, TiN, TiC, TiCN, TiAlN, TiO2, CrN, Y2O3, and Al2O3; and
    wherein the surface of the base body and a portion of the base portion of each of the protrusions are not covered by the protective layer.

* * * * *